(12) United States Patent
Aigner et al.

(10) Patent No.: US 7,339,445 B2
(45) Date of Patent: Mar. 4, 2008

(54) BAW DUPLEXER WITHOUT PHASE SHIFTER

(75) Inventors: Robert Aigner, Unterhaching (DE); Martin Handtmann, München (DE)

(73) Assignee: Infineon Technologies AG (DE)

( * ) Notice: Subject to any disclaimer, the term of this patent is extended or adjusted under 35 U.S.C. 154(b) by 221 days.

(21) Appl. No.: 11/246,996

(22) Filed: Oct. 7, 2005

(65) Prior Publication Data

US 2007/0080756 A1    Apr. 12, 2007

(51) Int. Cl.
*H03H 9/70* (2006.01)
(52) U.S. Cl. .................... 333/133; 333/189; 455/82
(58) Field of Classification Search ............. 333/133
See application file for complete search history.

(56) References Cited

U.S. PATENT DOCUMENTS

| | | | |
|---|---|---|---|
| 6,262,637 B1 * | 7/2001 | Bradley et al. ............. | 333/133 |
| 6,313,715 B1 * | 11/2001 | Bergmann et al. .......... | 333/133 |
| 6,927,649 B2 * | 8/2005 | Metzger et al. ............. | 333/133 |
| 7,034,635 B2 * | 4/2006 | Nakamura et al. .......... | 333/133 |
| 7,126,440 B2 * | 10/2006 | Bradley et al. ............. | 333/133 |
| 2006/0066419 A1 * | 3/2006 | Iwaki et al. ................ | 333/133 |
| 2006/0139121 A1 * | 6/2006 | Jhung ........................ | 333/133 |

FOREIGN PATENT DOCUMENTS

| JP | 2004-112277 | * | 4/2004 |
|---|---|---|---|
| WO | WO 2004/047290 | * | 6/2004 |

* cited by examiner

*Primary Examiner*—Barbara Summons
(74) *Attorney, Agent, or Firm*—Coats & Bennett, P.L.L.C.

(57) ABSTRACT

A duplexer for connection with an antenna comprises an antenna port, a transmitting filter comprising bulk acoustic wave (BAW) resonators having a first antenna side impedance coupled with the antenna port, a receiving filter comprising BAW resonators having a second antenna side impedance coupled with the antenna port, and a shunt inductance coupled between the antenna port and ground. The shunt inductance and the first and second antenna side impedances of the transmitting filter and the receiving filter are selected in such a way that the shunt inductance turns the first and second input impedance in a negative direction in a Smith diagram.

14 Claims, 10 Drawing Sheets

BAW DUPLEXER WITHOUT PHASE SHIFTER

TECHNICAL FIELD

The present application relates to duplexer for use in a transmitter, such as a mobile phone.

BACKGROUND

In many different communications applications, such as mobile phones or any other transceiver, a common signal path is coupled both to the input of a receiver and to the output of a transmitter. In such a transceiver, an antenna may be coupled to the input of the receiver and to the output of the transmitter. A duplexer is, thus, used to couple the common signal path to the input of the receiver and to the output of the transmitter. The duplexer provides the necessary coupling while preventing the modulated transmit signal generated by the transmitter from being coupled from the antenna back to the input of the receiver and overloading the receiver. A duplexer generally consists, thus, of three ports. At the antenna both signals coexist representing incoming and outgoing signals. To avoid collision of these signals, usually different frequency bands are allocated to the Tx and Rx path. The main purpose of a duplexer is to direct incoming Rx signals to the receiver port and to guard TX signals from the TX port to the antenna. To this end, a duplexer usually comprises two highly selective radio frequency (RF) filters for the respective Tx and Rx frequency bands. The RF-filters need to have sufficient rejection for the opposite band. At the antenna port, both filters are connected in parallel. In order to avoid that the two filters degrade each other's impedance a matching network is required.

FIGS. 1 and 2 show exemplary embodiments of such duplexers according to the prior art. In FIG. 1, the antenna port is coupled directly to the transmitting filter 110 (Tx) whereas a transmission line 130 is used to couple the antenna port with the receiving filter 120 (Rx). The transmission line is usually a 90° phase shifting device for transforming the impedance of the Rx filter 120. The Tx filter usually comprises a filter 111 with acoustic resonator devices such as thin film resonators or as applied in the present invention bulk acoustic wave resonators (BAW). An optional shunt matching network 113 and optional output matching network 112 are provided depending on the respective application as shown in filter 110 of FIG. 1. The Rx filter 120 comprises similar elements with BAW filter 121, and networks 122 and 123.

FIG. 2 shows another exemplary embodiment of a duplexer 200 according to the prior art. Similar elements carry similar numerals. In this embodiment a so-called pi-network 210 is used instead of the transmission line 130. The pi-network 210 consists of two capacitors each connected on one side with ground and coupled on the other side through an inductor. Both implementations, the transmission line 130 as well as the pi-network 210 provide for a +90° phase shift and impedance transformation. Both function as a delay line, the transmission line 130 comprises a quarter wavelength and the pi-network comprises shunt capacitors and a series inductance. The +90° phase shifting is required to transform the input impedance which the Rx filter presents towards the antenna to high values at the Tx frequency range to effectively block the TX signals. The input impedance of the Tx filter in the Rx frequency range is typically high by default and does not require additional impedance transformation or phase shifting.

SUMMARY

Conventional duplexers as described above have several drawbacks. For example, the delay line enforces the use of a multilayer substrate and requires a relatively large area. The losses of the delay line or of the pi-network affect an insertion loss for both Rx and Tx signal paths. Furthermore, a +90° phase shift has by its nature already an unwanted low pass characteristic and does not provide a DC current path down to ground. Additional circuitry is, thus, required to ensure electro static discharge (ESD) protection and robustness.

According to an embodiment, a duplexer for connection with an antenna comprises an antenna port, a transmitting filter comprising bulk acoustic wave (BAW) resonators having a first antenna side impedance coupled with the antenna port, a receiving filter comprising BAW resonators having a second antenna side impedance coupled with the antenna port, and a shunt inductance coupled between the antenna port and ground, wherein the shunt inductance and the first and second antenna side impedances of the transmitting filter and the receiving filter are selected in such a way that the shunt inductance turns the first and second input impedance in a negative direction in a Smith diagram.

According to another embodiment, a duplexer for connection with an antenna according comprises an antenna port, a transmitting filter having an antenna side and a signal input side, the transmitting filter comprising bulk acoustic wave (BAW) resonators having at least a first series BAW resonator coupled with the antenna side, a receiving filter, having an antenna side and a signal output side, the receiving filter comprising bulk acoustic wave (BAW) resonators having at least a second series BAW resonator coupled with the antenna side, and a shunt inductance coupled between the antenna port and ground.

According to another embodiment, a duplexer for connection with an antenna comprises means for filtering a transmission signal by bulk acoustic wave (BAW) resonators wherein the means comprise a first antenna side impedance, means for filtering a receiving signal by bulk acoustic wave (BAW) resonators wherein the means comprise a second antenna side impedance, means for coupling the means for filtering the transmission signal and for filtering the receiving signal with an antenna, and a shunt inductance means coupled between the antenna port and ground for shifting the first and second antenna side impedance in a negative direction in a Smith diagram.

A rotation of the input impedance can be established by approximately −90°. The transmitting filter may comprise a plurality of series connected BAW resonators and a plurality of shunt BAW resonators. The duplexer may comprise four series BAW resonators and three shunt BAW resonators wherein each shunt BAW resonators is coupled between a node between two series BAW resonators and ground. The duplexer may further comprise bond wire inductances for signal coupling of the series circuit of BAW resonators and for coupling the shunt BAW resonators with ground. The transmitting filter and the receiving filter can be coupled with the antenna port through bond wire inductances. The receiving filter may comprise a plurality of series connected BAW resonators and a plurality of shunt BAW resonators. The duplexer may comprise in, particular four series BAW resonators and four shunt BAW resonators wherein each shunt BAW resonators is coupled with a terminal of one series BAW resonators and ground. The duplexer may further comprise bond wire inductances for signal coupling of the series circuit of BAW resonators and for coupling the shunt BAW resonators with ground. The transmitting filter and the receiving filter each can be implemented on a chip. The transmitting filter chip and the receiving filter chip can be arranged on a substrate. The transmitting filter chip can also be mounted on the substrate by flip-chip technology.

According to another embodiment, a method for processing signals through a duplexer for an antenna comprises the steps of filtering a transmission signal by means of bulk acoustic wave (BAW) resonators wherein the means comprise a first antenna side impedance; filtering a receiving signal by means of bulk acoustic wave (BAW) resonators wherein the means comprise a second antenna side impedance; coupling the means for filtering the transmission signal and for filtering the receiving signal with an antenna; and shifting the first and second antenna side impedance in a negative direction by means of a shunt inductance coupled between the antenna port and ground.

DETAILED DESCRIPTION

Figure 3:
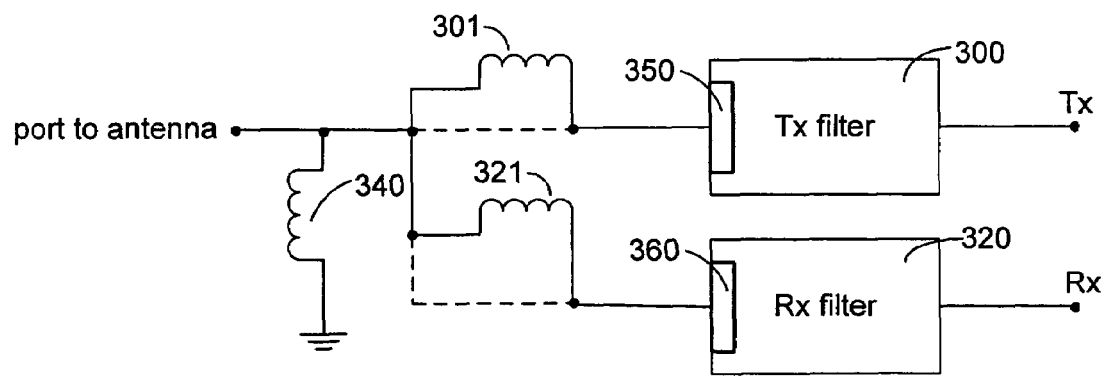
FIG. 3 shows a principal circuit diagram of one embodiment according to the present invention.

FIG. 3 shows one embodiment of an improved duplexer. Again, a Tx filter 300 and a Rx filter 320 are provided. The Tx filter has a specific impedance 350 on the antenna side. Similarly, the Rx has its specific impedance 360 on the antenna side. These antenna side couplings of Tx filter 300 and Rx filter 320 are, for example, coupled through bond wire inductances 301 and 321 with the antenna port. Alternatively, a direct coupling without inductances is possible as indicated by the broken connection lines. Thus, the bond wire connections 301, 321 are optional and are only present if the manufacture technology requires bond wire connection for the substrate and the BAW chip. If the manufacture technology allows for a flip-chip mounting, no inductances are necessary. According to FIG. 3, the antenna port is provided with a shunt inductance 340 which couples the antenna port with ground.

Figure 1:
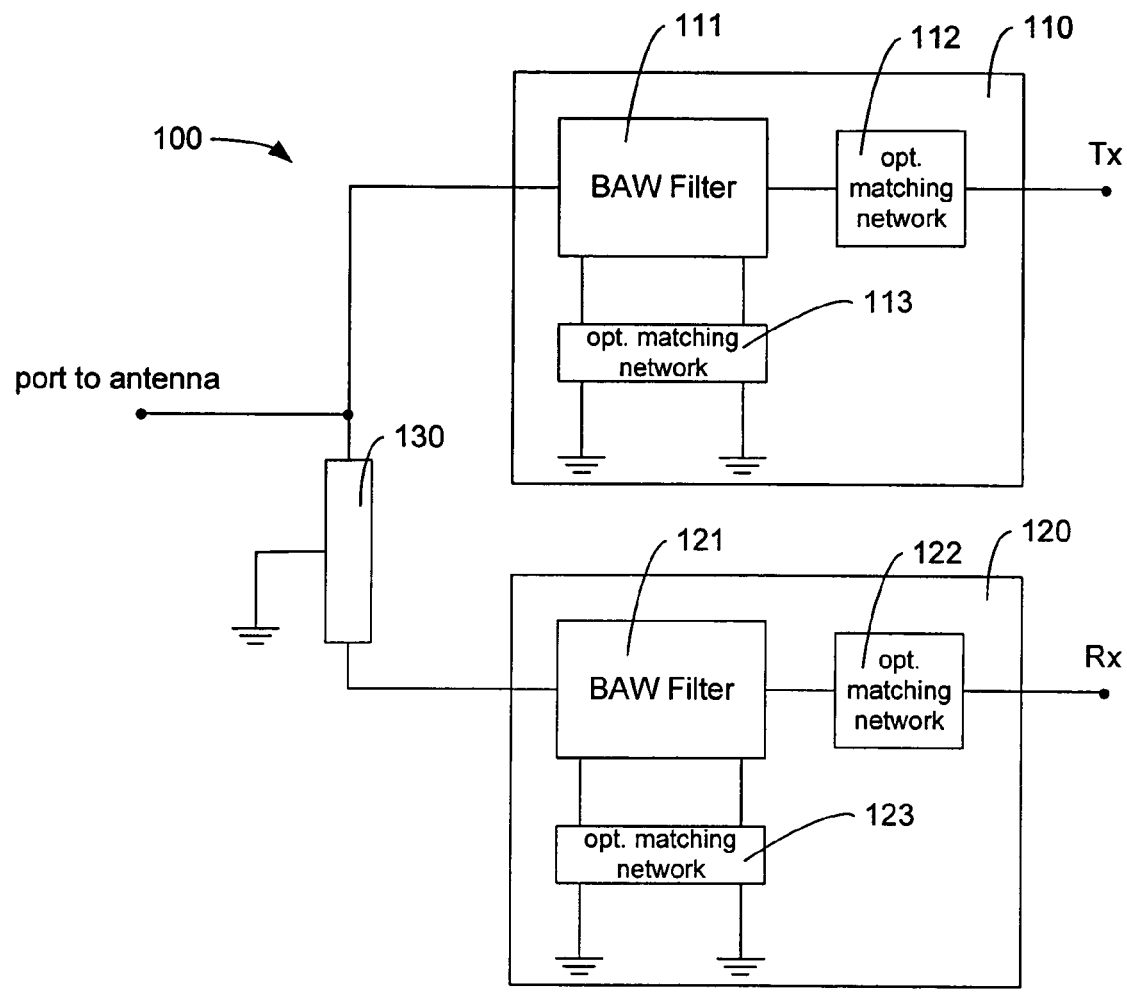
FIGS. 1 and 2 show embodiments of duplexers according to the prior art.
Figure 2:
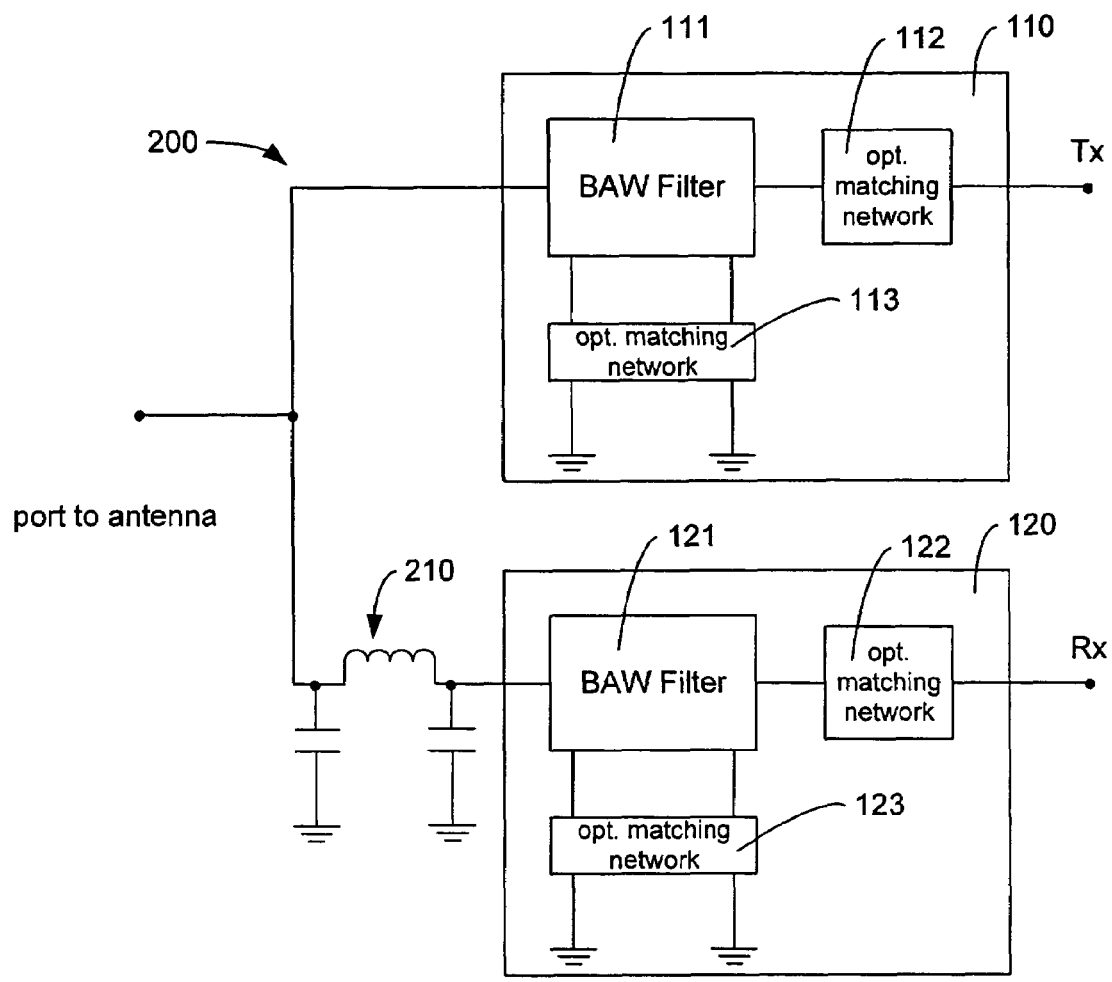

Instead of a transmission line or a pi-network, this embodiment comprises a shunt inductance 340 at the antenna side. Thus, the antenna side of the TX filter 300 and the antenna side of the RX filter 320 are either coupled directly or through respective bond wire inductances 301, 321 with the antenna port which is coupled through shunt inductance 340 with ground. This specific arrangement, thus, results in a transformation of the input impedance which results in a high pass characteristic. In a Smith diagram, this shows as a rotation in a negative direction such as a −90° phase rotation. However, the negative rotation angle may be established in a relatively broad range. To achieve appropriate matching for the respective frequency bands of the Tx and Rx paths, in one embodiment the filter topology can be respectively chosen. For example, in a conventional duplexer as shown in FIGS. 1 and 2, the Rx filter starts first with a shunt resonator at the antenna side because this results in a shorter delay time requirement. However, with the shunt inductance 340 being "external" of the Rx filter as shown in the embodiment in FIG. 4, here, for example, a series resonator 322 can be implemented as the first element of the Rx filter on the antenna side because this results in a shorter transformation path. In one embodiment, the Tx filter can be modified in a way to accommodate the transformation by the shunt inductance 340 and the input capacitance of the Rx filter.

The shunt inductance matching scheme as shown in FIG. 3 has the benefit that the shunt inductor 340 is easier to integrate into a substrate and requires less real estate. Furthermore, inductances are less sensitive to manufacture tolerances than delay lines or pi-networks. Also, in establishing a negative rotation angle, the shunt inductance can be usually smaller as compared to a transmission line or pi-network according to the prior art. Finally, the shunt inductor 340 at the antenna port may provide for a perfect DC path to ground and makes the antenna port inherently ESD robust.

The difference between a conventional duplexer matching scheme as shown in FIGS. 1 and 2 to the proposed duplexer as, for example, shown in FIG. 3, is that the input impedances of the Tx and Rx filters are designed to become an integral part of the matching circuitry. In the Tx frequency band, the input impedance 360 of the Rx filter 320 forms a parallel resonance with the shunt inductance 340. On the other hand, in the Rx frequency band, the Tx filter resonates with the shunt inductance 340.

Figure 4:
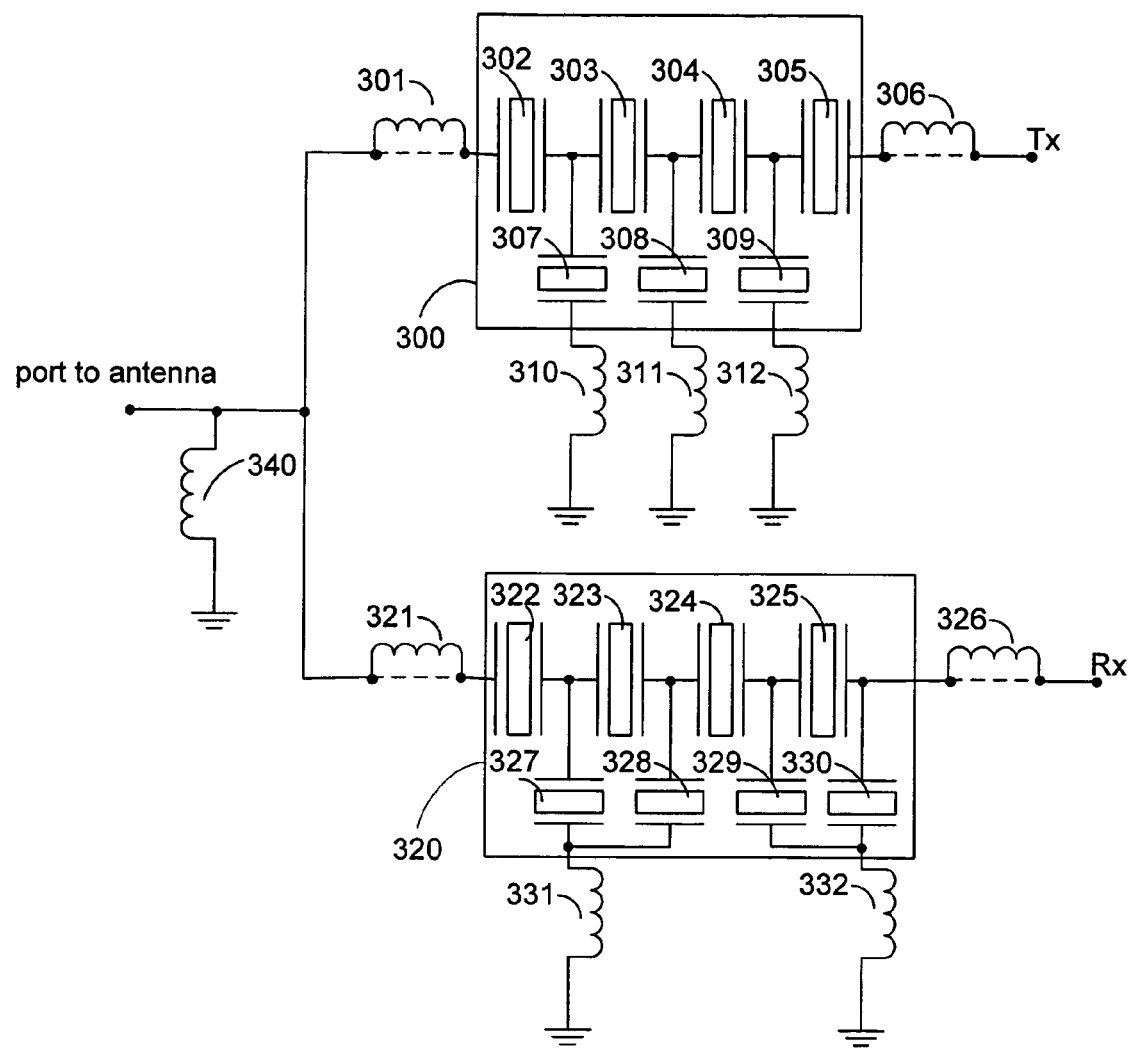
FIG. 4 shows a more detailed embodiment of the Tx and Rx filters according to the present invention.

FIG. 4, shows an embodiment of such an arrangement as shown in FIG. 3. The Tx filter path comprises inductor 301, four BAW resonators 302, 303, 304, and 305, and inductor 306 coupled in series. Between each node of BAW resonators 302, 303; 303, 304; and 304, 305 and ground a shunt BAW resonator 307, 308, 309 is coupled in series with a respective shunt inductor 310, 311, 312. The inductors 301 and 306 represent bond wire inductances which again depending on the manufacture technology might not be present as indicated by the broken connection line.

The Rx filter path comprises inductor 321, four BAW resonators 322, 323, 324, and 325, and inductor 326 coupled in series. Between each node of BAW resonators 322, 323; 323, 324; 324, 325; and between BAW resonator 325 and inductor 326 one terminal of a shunt BAW resonator 327, 328, 329 and 330 is coupled. The other terminals of BAW resonators 327 and 328 are coupled with ground via an inductor 331. The other terminals of ;BAW resonators 329 and 330 are coupled with ground via an inductor 332. Again, the inductors 321 and 326 represent bond wire inductances.

The Tx filter 300 and the Rx filter 320 can each be implemented on a separate filter chip. The duplexer consists then of these filter chips 300, 320 and a substrate on which these filters are located. As shown in FIG. 4, both filter chips 300, 320 comprise additional inductances 310-312 and 331, 332 in the ground connections. These inductors allow for additional notches in the stopband. Secondly, they help widening the bandwidth of the filters 300, 320. These shunt inductors 310-312 and 331, 332 may generally be realized as bond wires to a ground plane, a printed inductor on the substrate or may be a combination of both. Similarly, there are inductors 301, 306, and 321, 326 in series to each signal connection of the BAW filters 300, 320 which represent the wire bonds to connect these filters as stated above.

Both filters 300 and 320 start at the antenna side with a series resonator 302 and 322, respectively. The Rx filter 320 consists out of four shunt and 4 series resonators, i.e. four stages, while the Tx filter 300 in this embodiment comprises three shunt and four series resonators, i.e. 3.5 stages. The number of stages is a trade off between insertion loss/bandwidth versus stopband performance of the filters. Thus, other designs with more or less stages are possible as long as the above described principles for an antenna port shunt inductor matching scheme are met.

As an example, the resonance frequencies of the resonators for a Universal Mobile Telecommunications System (UMTS) duplexer can be chosen as: The Tx filter 300 has a pass band from 1920 MHz to 1980 MHz, while the Rx filter shows a pass band from 2110 MHz to 2170 MHz. In one embodiment, with properly chosen capacitances of the resonators, the topology according to the present invention may allow to match the antenna port with a printed inductor 340 of, for example, 3.3 nH. Thereby it is assumed, that the ground inductance of inductor 340 has a parasitic capacitance of 0.5 pF and a Q factor of 20.

Figure 5:
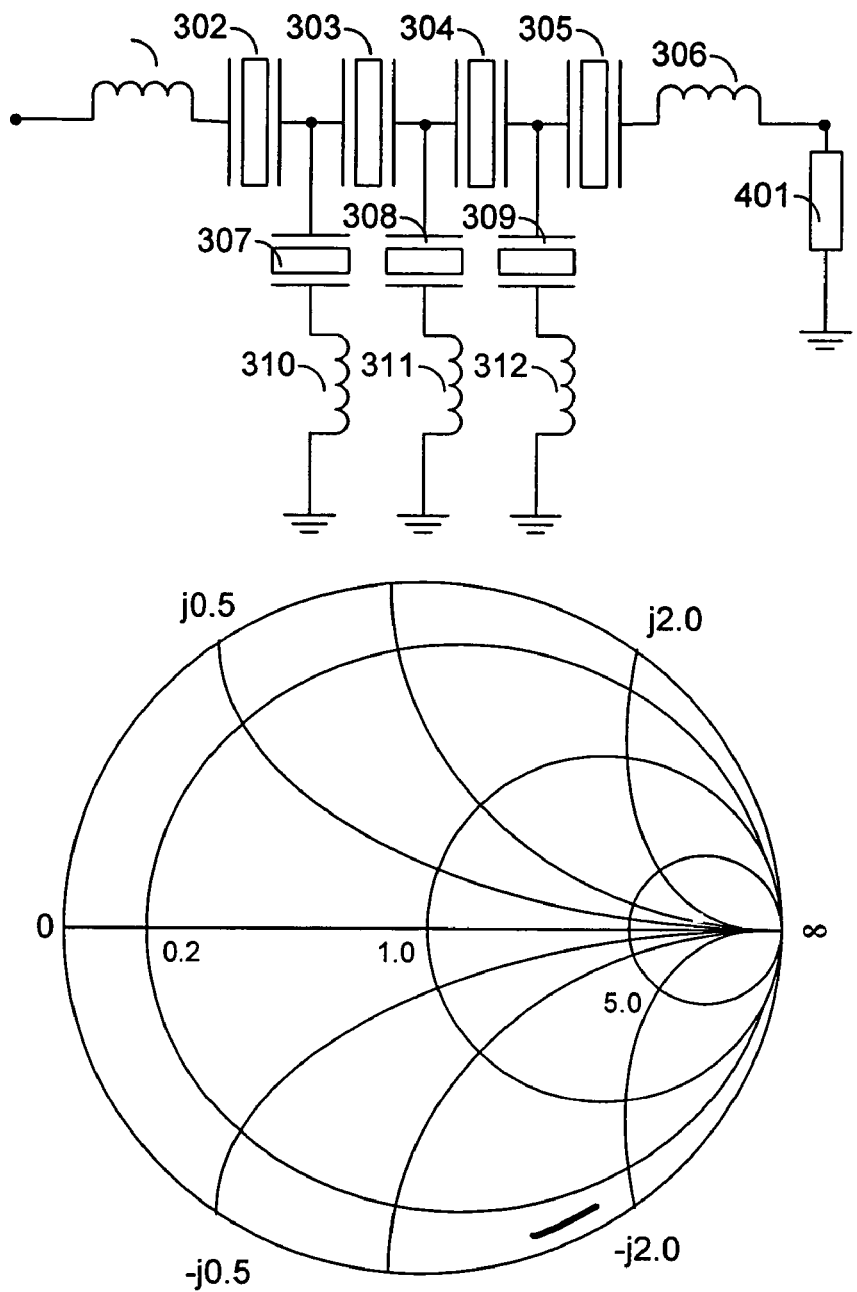
FIG. 5 depicts a Smith diagram of the characteristics of the Tx path without the shunt according to the invention.
Figure 6:
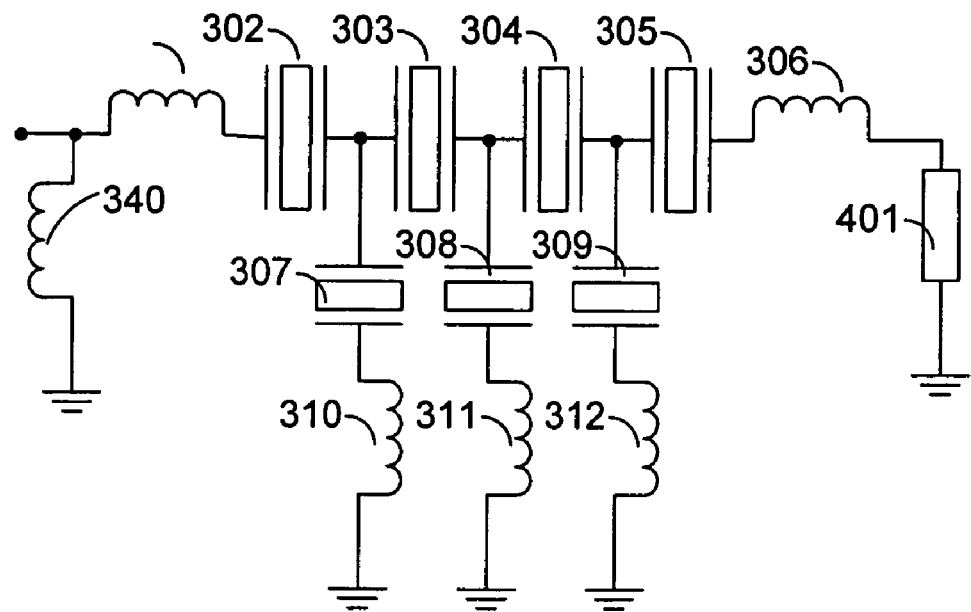
FIG. 6 depicts a Smith diagram of the characteristics of the Tx path with the shunt according to the invention.
Figure 6:
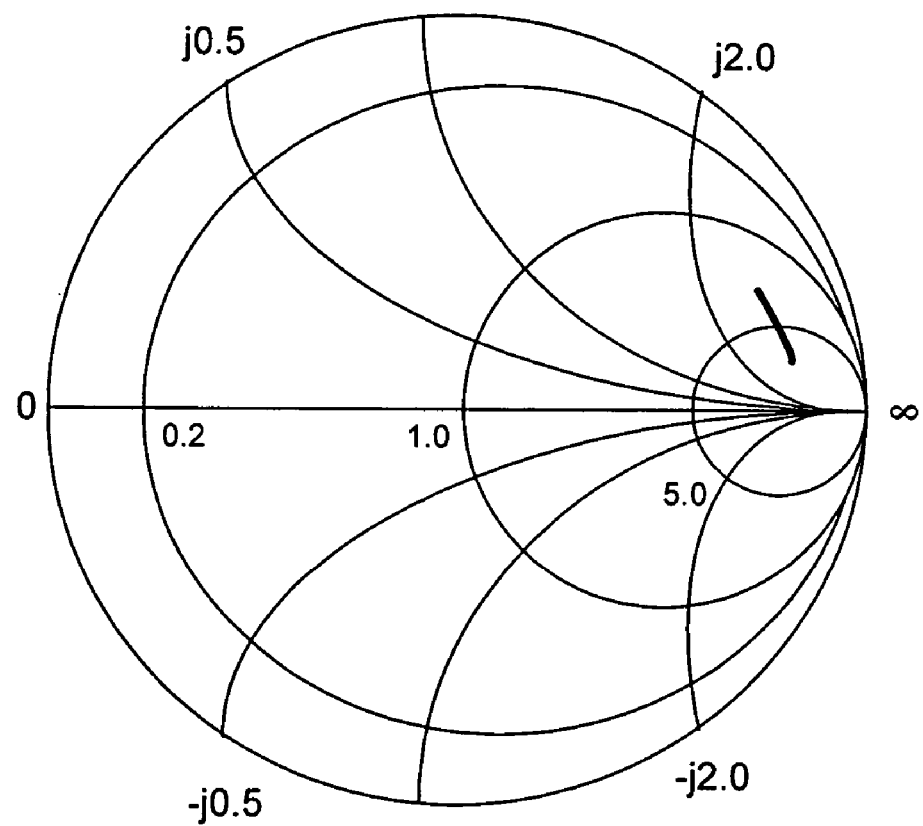
Figure 7:
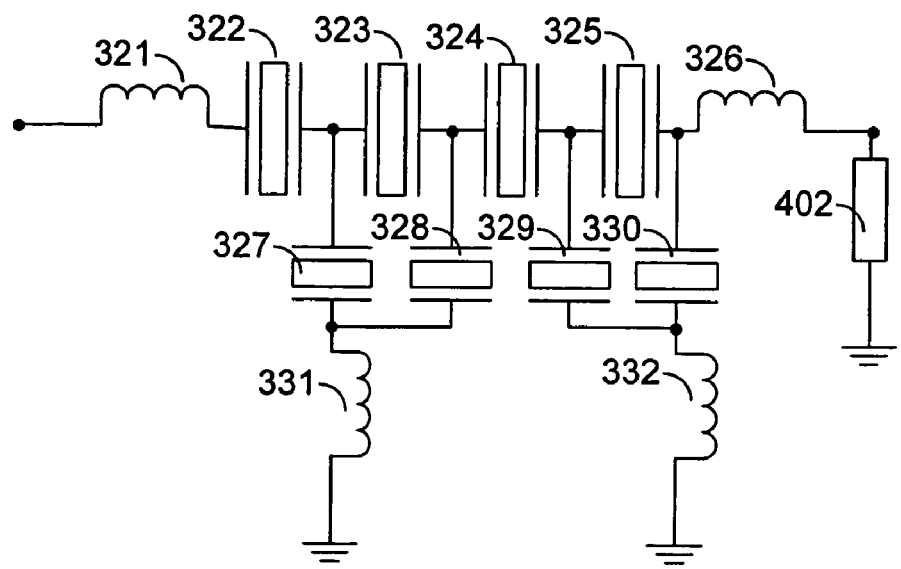
FIG. 7 depicts a Smith diagram of the characteristics of the Rx path without the shunt according to the invention.
Figure 7:
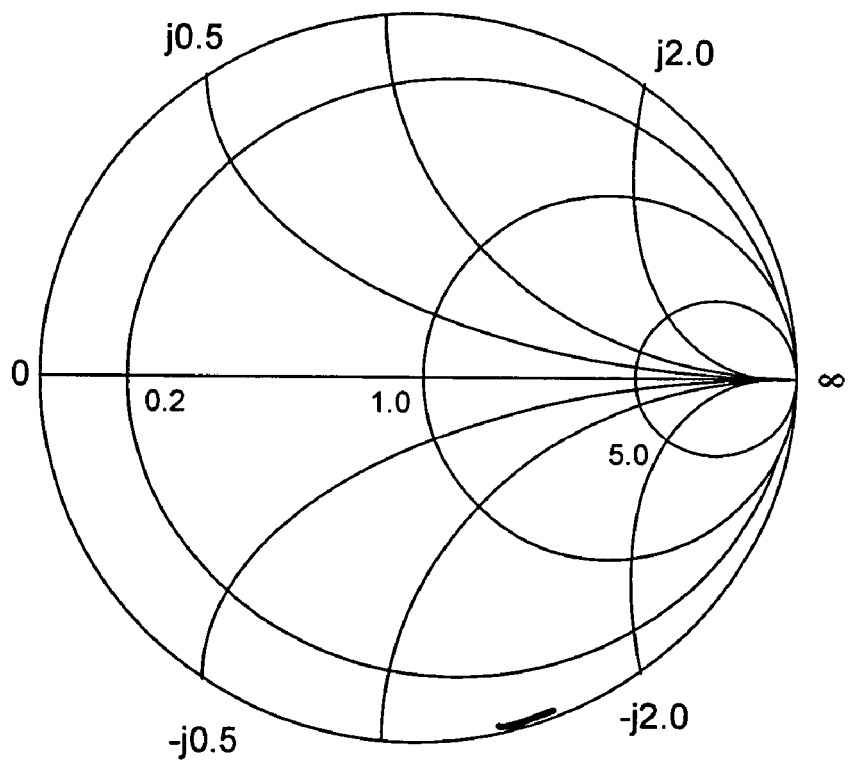
Figure 8:
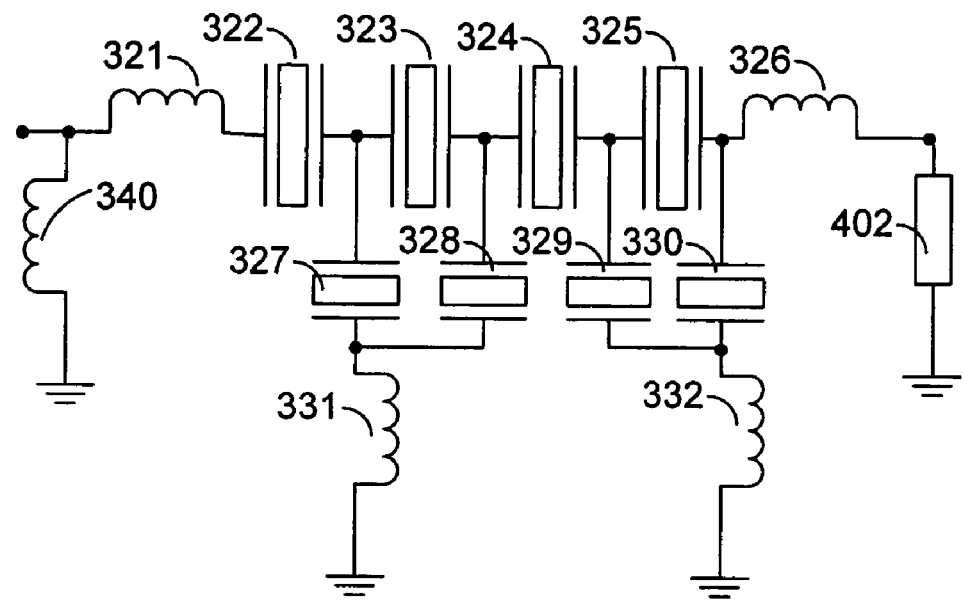
FIG. 8 depicts a Smith diagram of the characteristics of the Rx path with the shunt according to the invention.
Figure 8:
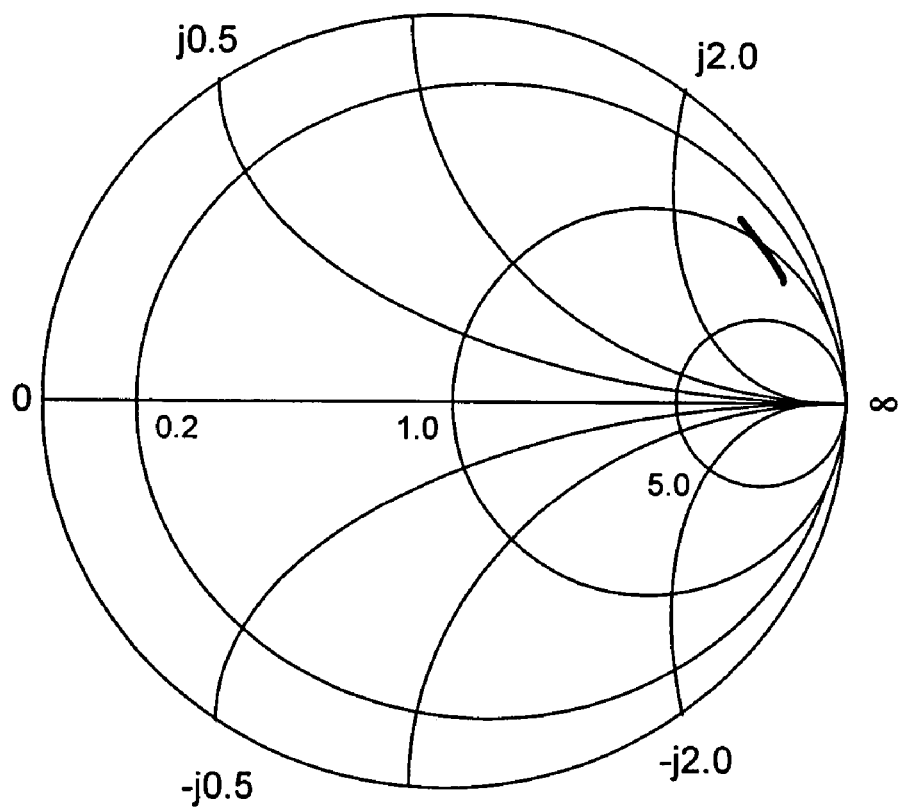

FIGS. 5-8 illustrate the effect of the shunt inductor on the input impedance (antenna side) of filters 300, 320. FIGS. 5-8 show on top the relevant filter coupled with the antenna port. Also a proper input load 401 or output load 402 is connected on the respective input or output side of the Tx or Rx filter 300, 320. FIGS. 5 and 7, show the Tx filter and Rx filter without the matching shunt inductances whereas FIGS. 6 and 8 show the same circuits with the implemented matching shunt inductance 340. On the bottom of each of FIGS. 5-8 is a Smith chart showing the effect of the shunt inductance as a polar plot of the complex reflection coefficient, which represents the ratio of the complex amplitudes of the backward and forward waves. In both cases, the shunt inductor turns anti-clockwise ("−90° phase shift") the input impedance from the capacitive into the inductive region. An inductive impedance of the "parasitic" branch can be easier to match in the pass band of a BAW filter since BAW filters tend to have a more capacitive input impedance in their pass bands. In one embodiment, due to the series resonators at the antenna signal ports of the filters, the starting input impedance lies already in the high ohmic capacitive region of the Smith chart. Therefore, the required phase rotation is small, resulting in a reasonable value for the shunt inductance 340.

Figure 9:
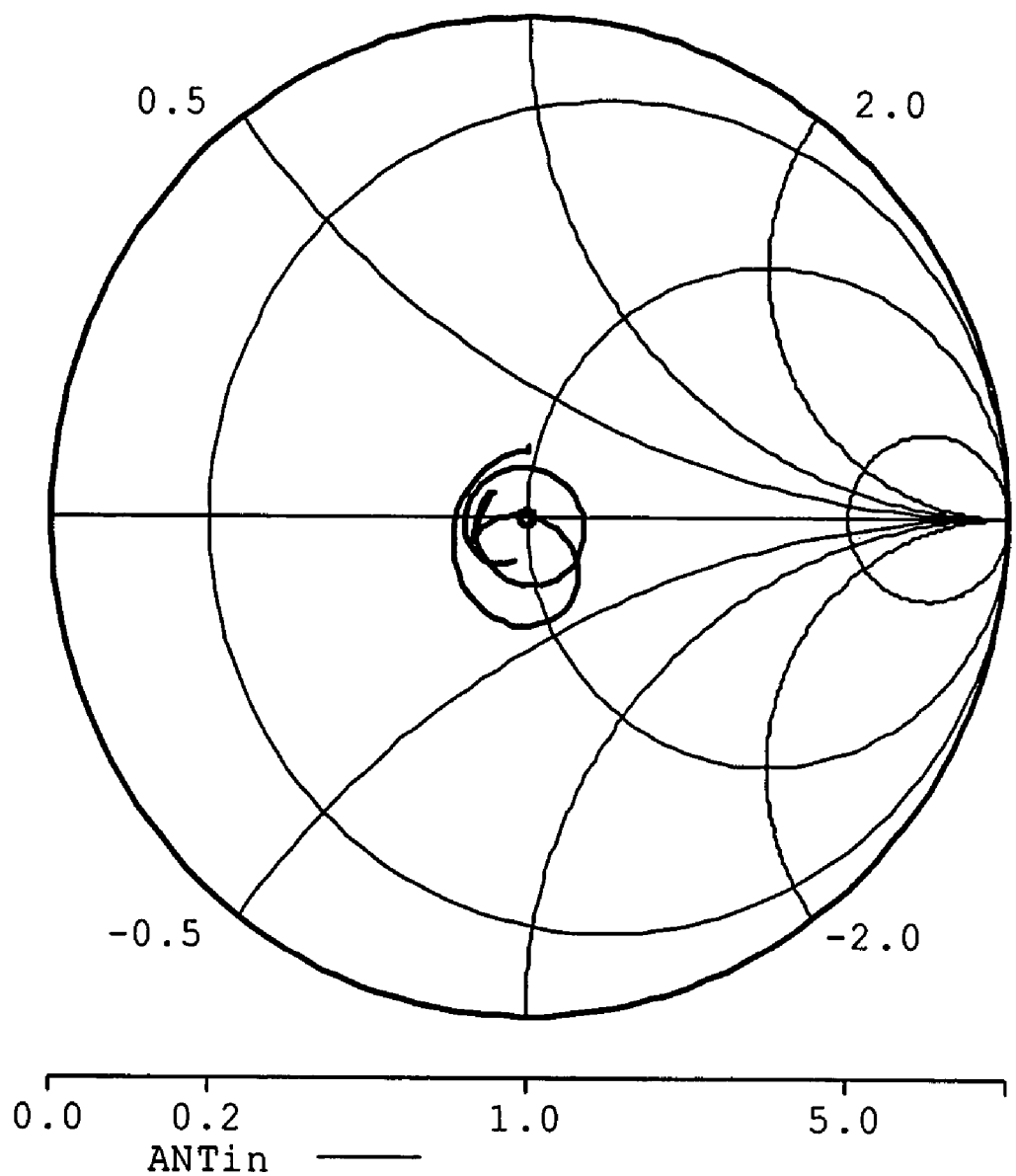
FIG. 9 depicts a Smith diagram of the characteristics of the overall input impedance of the antenna port of an arrangement according to the invention.
Figure 10:
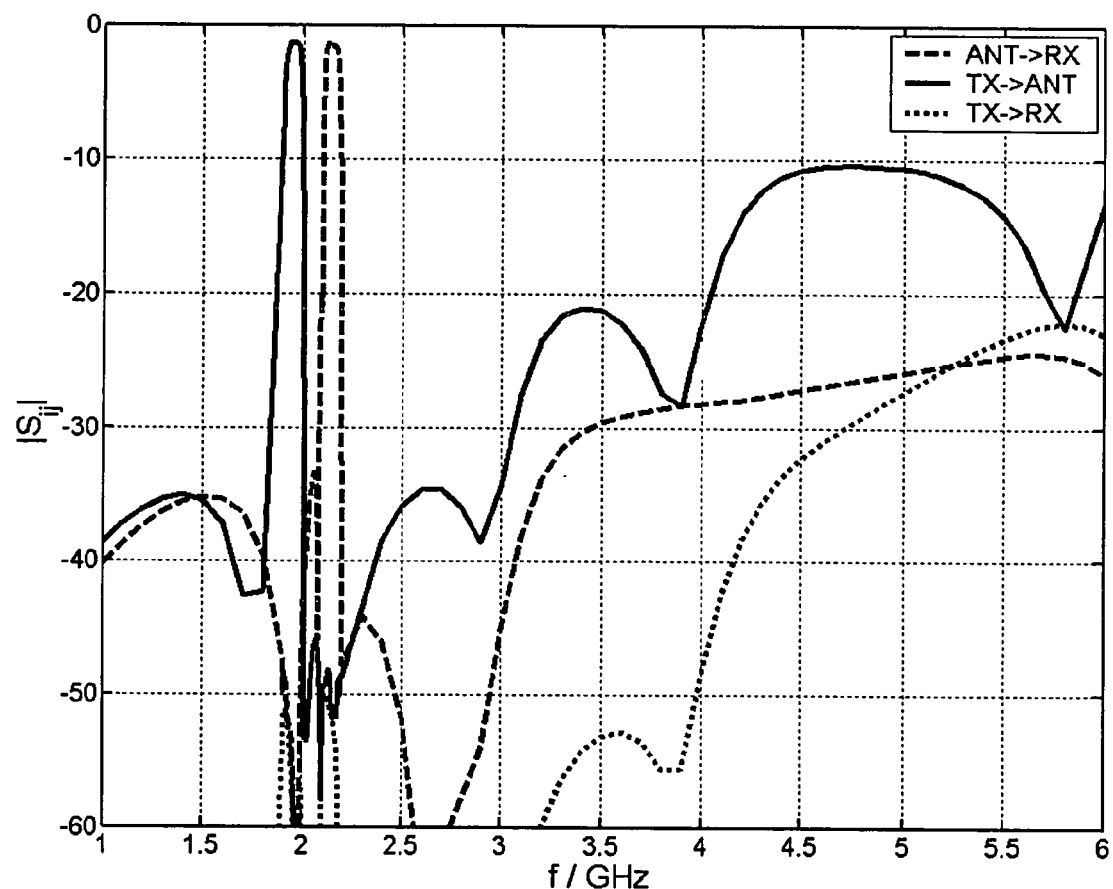
FIG. 10 shows the pass band characteristics of the Rx and Tx branch and the isolation between Rx and Tx paths.

FIG. 9 shows the overall input impedance of the antenna port of a duplexer as shown, for example, in FIG. 4. It is matched with a return loss better than −12 dB in the pass bands of the filters. Achieving this result implies a co-optimization of both filters with the goal to match the antenna port in both pass bands. Finally, FIG. 10 shows the pass band characteristics of the Rx- and Tx-branch and the isolation between Rx and Tx filters.

Figure 11:
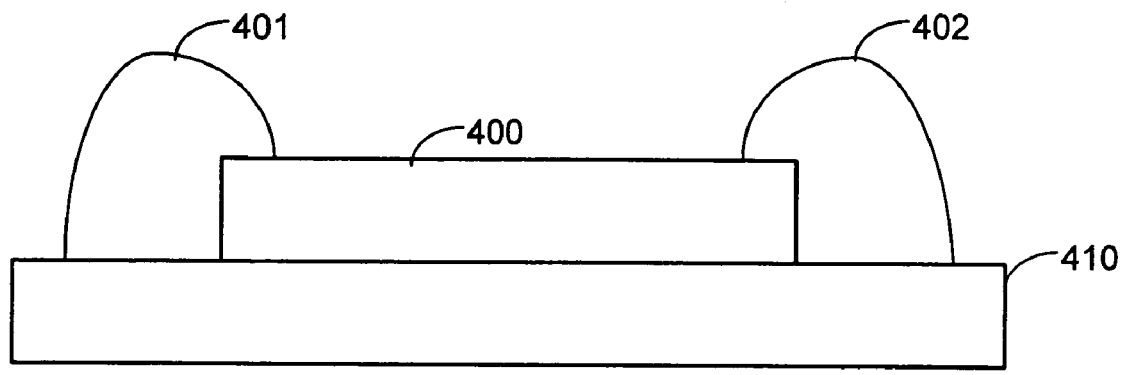
FIG. 11 shows a schematic embodiment of a substrate with a filter chip.

FIG. 11 shows a schematic embodiment of a substrate 410 with a filter chip 400 arranged on its surface. In this embodiment, bond wire connections 401 and 402 are shown which are used to establish input and output coupling as mentioned with respect to FIGS. 3 and 4.

Figure 12:
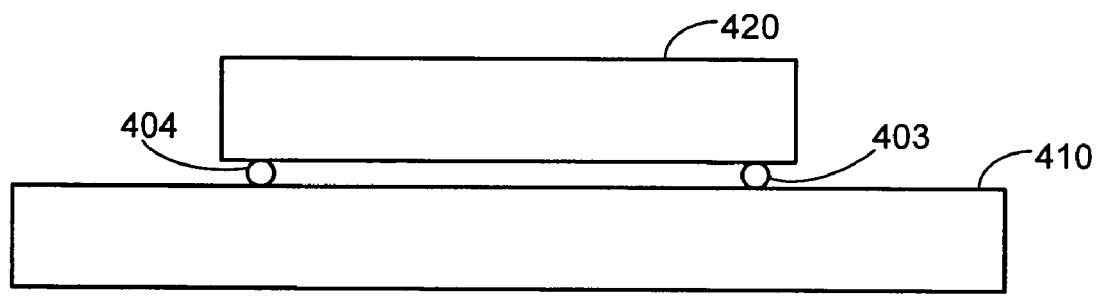
FIG. 12 shows a schematic embodiment of a substrate with a flip chip.

FIG. 12 shows another embodiment with a substrate 410 and a flip-chip 420. The electrical coupling between the flip chip and for example printed circuit board tracks on the substrate 410 is established, for example, by solder balls 403, 404 as mentioned with respect to FIGS. 3 and 4.

What is claimed is:

1. A duplexer for connection with an antenna comprising:
   an antenna port;
   a transmitting filter comprising bulk acoustic wave (BAW) resonators having a first antenna side impedance coupled with said antenna port;
   a receiving filter comprising BAW resonators having a second antenna side impedance coupled with said antenna port; and
   a shunt inductance coupled between said antenna port and ground, wherein the shunt inductance and the first and second antenna side impedances of said transmitting filter and said receiving filter are selected in such a way that the shunt inductance turns the first and second antenna side impedances in a negative direction in a Smith diagram.

2. A duplexer according to claim 1, wherein a rotation of the first and second antenna side impedances is established by approximately −90°

3. The duplexer according to claim 1, wherein the transmitting filter comprises a plurality of series connected BAW resonators and a plurality of shunt BAW resonators.

4. The duplexer according to claim 3, the transmitting filter comprising a series of four BAW resonators and three shunt BAW resonators wherein each shunt BAW resonators is coupled between a node between two series BAW resonators and ground.

5. The duplexer according to claim 4, the transmitting filter further comprising bond wire inductances for signal coupling of the series circuit of BAW resonators and for coupling the shunt BAW resonators with ground.

6. The duplexer according to claim 1, wherein the transmitting filter and the receiving filter are coupled with the antenna port through bond wire inductances.

7. The duplexer according to claim 1, wherein the receiving filter comprises a plurality of series connected BAW resonators and a plurality of shunt BAW resonators.

8. The duplexer according to claim 7, the receiving filter comprising a series of four BAW resonators and four shunt BAW resonators wherein each shunt BAW resonators is coupled with a terminal of one series BAW resonators and ground.

9. The duplexer according to claim 8, the receiving filter further comprising bond wire inductances for signal coupling of the series circuit of BAW resonators and for coupling the shunt BAW resonators with ground.

10. The duplexer according to claim 1, wherein the transmitting filter and the receiving filter each are implemented on a chip.

11. The duplexer according to claim 10, wherein the transmitting filter chip and the receiving filter chip are arranged on a substrate.

12. The duplexer according to claim 11, wherein the transmitting filter chip is mounted on the substrate by flip-chip technology.

13. A duplexer for connection with an antenna comprising:
   means for filtering a transmission signal by bulk acoustic wave (BAW) resonators wherein said means comprise a first antenna side impedance;
   means for filtering a receiving signal by bulk acoustic wave (BAW) resonators wherein said means comprise a second antenna side impedance;

means for coupling said means for filtering the transmission signal and for filtering the receiving signal with an antenna; and a shunt inductance means coupled between said antenna port and ground for shifting said first and second antenna side impedance in a negative direction in a Smith diagram.

14. A method for processing signals through a duplexer for an antenna comprising the steps of:

filtering a transmission signal by means of bulk acoustic wave (BAW) resonators wherein said means comprise a first antenna side impedance;

filtering a receiving signal by means of bulk acoustic wave (BAW) resonators wherein said means comprise a second antenna side impedance;

coupling said means for filtering the transmission signal and for filtering the receiving signal with an antenna; and shifting said first and second antenna side impedance in a negative direction in a Smith diagram by means of a shunt inductance coupled between said antenna port and ground.

* * * * *